(12) United States Patent
Ko et al.

(10) Patent No.: US 9,673,105 B2
(45) Date of Patent: Jun. 6, 2017

(54) CMOS DEVICES WITH SCHOTTKY SOURCE AND DRAIN REGIONS

(71) Applicant: Taiwan Semiconductor Manufacturing Company, Ltd., Hsin-Chu (TW)

(72) Inventors: Chih-Hsin Ko, Fongshan (TW);
Hung-Wei Chen, Hsin-Chu (TW);
Chung-Hu Ke, Taipei (TW);
Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 617 days.

(21) Appl. No.: 13/867,813

(22) Filed: Apr. 22, 2013

(65) Prior Publication Data

US 2014/0094008 A1    Apr. 3, 2014

Related U.S. Application Data

(60) Division of application No. 13/113,530, filed on May 23, 2011, now Pat. No. 8,426,298, which is a
(Continued)

(51) Int. Cl.
*H01L 21/8238* (2006.01)
*H01L 29/10* (2006.01)
(Continued)

(52) U.S. Cl.
CPC .. *H01L 21/823814* (2013.01); *H01L 29/1054* (2013.01); *H01L 29/47* (2013.01);
(Continued)

(58) Field of Classification Search
CPC ....... H01L 21/823814; H01L 29/66568; H01L 29/6653; H01L 29/6659; H01L 29/7843;
(Continued)

(56) References Cited

U.S. PATENT DOCUMENTS 5,552,332 A    9/1996  Tseng et al.
6,303,479 B1  10/2001  Snyder
(Continued)

FOREIGN PATENT DOCUMENTS

CN         101060082 A    10/2007

OTHER PUBLICATIONS

Kawaura, H., et al., "Transistor Operation of 30-nm Gate-Length EJ-MOSFETs," IEEE Electron Device Letters, vol. 19, No. 3, Mar. 1998, pp. 74-76.
(Continued)

*Primary Examiner* — Julio J Maldonado
*Assistant Examiner* — Stanetta Isaac
(74) *Attorney, Agent, or Firm* — Slater Matsil, LLP (57) ABSTRACT

A semiconductor structure includes a semiconductor substrate, and an NMOS device at a surface of the semiconductor substrate, wherein the NMOS device comprises a Schottky source/drain extension region. The semiconductor structure further includes a PMOS device at the surface of the semiconductor substrate, wherein the PMOS device comprises a source/drain extension region comprising only non-metal materials. Schottky source/drain extension regions may be formed for both PMOS and NMOS devices, wherein the Schottky barrier height of the PMOS device is reduced by forming the PMOS device over a semiconductor layer having a low valence band.

20 Claims, 7 Drawing Sheets

Related U.S. Application Data continuation of application No. 11/704,402, filed on Feb. 9, 2007, now abandoned.

(51) Int. Cl.
*H01L 29/47* (2006.01)
*H01L 29/66* (2006.01)
*H01L 29/78* (2006.01)
*H01L 29/165* (2006.01)

(52) U.S. Cl.
CPC ........ *H01L 29/665* (2013.01); *H01L 29/6653* (2013.01); *H01L 29/6659* (2013.01); *H01L 29/66568* (2013.01); *H01L 29/66643* (2013.01); *H01L 29/7843* (2013.01); *H01L 29/165* (2013.01)

(58) Field of Classification Search
CPC ... H01L 29/1054; H01L 29/47; H01L 29/665; H01L 29/66643; H01L 29/165; H01L 21/76897; H01L 29/41783
See application file for complete search history.

(56) References Cited

U.S. PATENT DOCUMENTS

| | | | |
|---|---|---|---|
| 6,413,829 B1 * | 7/2002 | Yu | ................................ 438/311 |
| 6,495,882 B2 | 12/2002 | Snyder | |
| 6,696,334 B1 | 2/2004 | Hellig et al. | |
| 6,720,627 B1 | 4/2004 | Iwata et al. | |
| 6,744,103 B2 | 6/2004 | Snyder | |
| 6,924,181 B2 | 8/2005 | Huang et al. | |
| 2002/0008289 A1 | 1/2002 | Murota et al. | |
| 2002/0048841 A1 | 4/2002 | Bryant et al. | |
| 2003/0235936 A1 | 12/2003 | Snyder et al. | |
| 2004/0129982 A1 | 7/2004 | Oda et al. | |
| 2005/0045965 A1 | 3/2005 | Lin et al. | |
| 2005/0247986 A1 | 11/2005 | Ko et al. | |
| 2006/0258074 A1 * | 11/2006 | Visokay et al. | .............. 438/199 |
| 2007/0007590 A1 | 1/2007 | Kinoshita et al. | |
| 2007/0090462 A1 * | 4/2007 | Wu | ................... H01L 21/82380 257/369 |
| 2008/0145984 A1 * | 6/2008 | Ke et al. | ....................... 438/197 |

OTHER PUBLICATIONS

Ikeda, K., et al., "50-nm Gate Schottky Source/Drain p-MOSFETs With a SiGe Channel," IEEE Electron Device Letters, vol. 12, No. 11, Nov. 2002, pp. 670-672.

Kinoshita, A., et al., "Solution for High-Performance Schottky-Source/Drain MOSFETs: Schottky Barrier Height Engineering with Dopant Segregation Technique," 2004 Symposium on VLSI Technology Digest of Technical Papers, pp. 168-169, IEEE.

Kinoshita, A., et al., "Successful CMOS Operation of Dopant-Segregation Schottky Barrier Transistors (DS-SBTs)," Extended Abstracts of the 2004 International Conference on Solid State Devices and Materials, Tokyo, 2004, pp. 172-173.

* cited by examiner

CMOS DEVICES WITH SCHOTTKY SOURCE AND DRAIN REGIONS

This application is a divisional of U.S. patent application Ser. No. 13/113,530, filed on May 23, 2011, entitled "CMOS Devices with Schottky Source and Drain Regions," which application is a continuation of U.S. patent application Ser. No. 11/704,402, filed on Feb. 9, 2007, entitled "CMOS Devices with Schottky Source and Drain Regions," which applications are hereby incorporated herein by reference.

TECHNICAL FIELD

This invention relates generally to semiconductor devices, and more particularly to manufacturing processes of metal-oxide-semiconductor (MOS) devices with Schottky source and drain regions.

BACKGROUND

Complementary metal-oxide-semiconductor (CMOS) devices have been the basic logic building block in the digital-dominant world for decades. Device dimensions have been continuously reduced in order to achieve higher performance as well as higher packing density. When the CMOS devices become increasingly smaller, the device drive currents become increasingly greater. The greater drive currents require that the source/drain resistances $R_{SD}$ be small. In conventional MOS devices, $R_{SD}$ is related to the doping concentration in the source/drain regions. Therefore, small $R_{SD}$ were achieved by increasing the dopant concentrations in source/drain extension regions and source/drain regions. In the past, the reduction in $R_{SD}$ could not meet the requirement of the increase in drive currents.

Schottky source/drain regions and source/drain extension regions, which included metals for forming Schottky contacts with the adjoining semiconductor materials, are thus explored for lowering $R_{SD}$. The advantageous features of Schottky barrier MOS (SBMOS) devices include low fabrication cost, low thermal budget for the source and drain formation, improved carrier transport, and high scalability. However, high barrier heights between the source/drain regions and the adjoining semiconductor materials often incur high series of resistances, and hence the improvement in the drive currents is limited. Therefore, low Schottky barriers are necessary for obtaining high drive currents. In the conventional single-metal scheme in which a single metal (typically mid-gap metal) is used for forming Schottky source/drains of both p-type MOS (PMOS) and n-type MOS (NMOS) devices, the barrier heights of the Schottky junctions of NMOS devices may be reduced by increasing the dopant concentration of the semiconductor materials adjoining the junctions. However, for PMOS devices, the reduction in barrier junction heights quickly saturates the increase in boron concentration. As such, the conventional single metal scheme cannot provide adequately low Schottky barriers.

Figure 1:
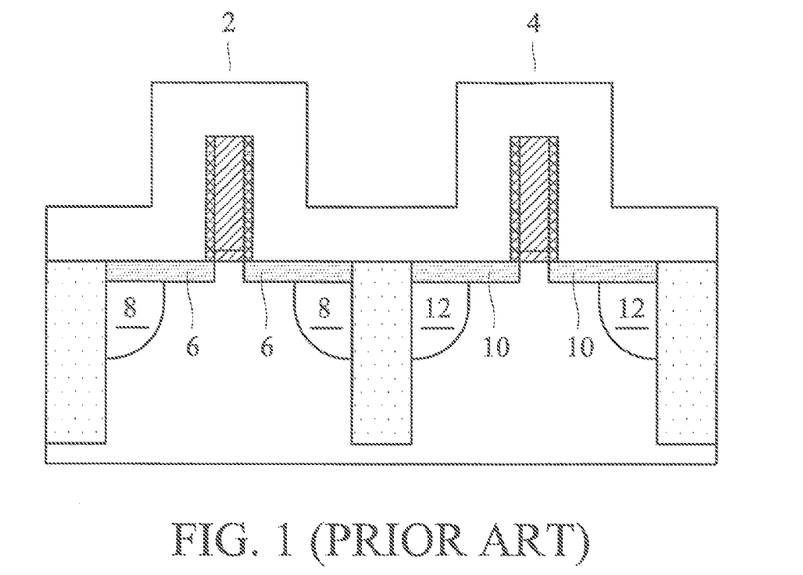
FIG. 1 illustrates a conventional complementary Schottky metal-oxide-semiconductor (CMOS) structure formed using a dual-metal scheme.

The metals used in the source/drain regions preferably have band-edge work functions, that is, for an NMOS device, the work function of the respective metal needs to be close to the conduction band of the adjoining semiconductor material. For a PMOS device, the work function of the respective metal needs to be close to the valence band of the adjoining semiconductor material. To meet this requirement, a dual-metal scheme is used for forming NMOS and PMOS devices. For example, ErSi and PtSi have been used in Schottky source/drain regions of NMOS and PMOS, respectively. FIG. 1 illustrates a conventional Schottky CMOS structure, which includes NMOS device 2 and PMOS device 4. NMOS device 2 includes Schottky source/drain extensions 6 and source/drain regions 8, while PMOS device 4 includes Schottky source/drain extensions 10 and source/drain regions 12. Schottky source/drain extensions 6 include a first metal with a low work function, such as ErSi, while Schottky source/drain extensions 10 include a second metal with a high work function, such as PtSi. Since both the first and the second metals have band-edge work functions, the barrier heights for both PMOS and NMOS devices are low.

The conventional dual-metal scheme suffers drawbacks, however. Schottky source/drain extensions 6 and 10 need to be separately formed, thus incurring a higher cost. Thus, novel CMOS structures and the methods for forming the same that may take advantage of improved performance without increasing manufacturing cost are needed.

SUMMARY OF THE INVENTION

In accordance with one aspect of the present invention, a semiconductor structure includes a semiconductor substrate, and an NMOS device at a surface of the semiconductor substrate, wherein the NMOS device comprises a Schottky source/drain extension region; and a PMOS device at the surface of the semiconductor substrate, wherein the PMOS device comprises a source/drain extension region comprising only non-metal materials.

In accordance with another aspect of the present invention, a semiconductor structure includes a semiconductor substrate, and an NMOS device at a surface of the semiconductor substrate. The NMOS device includes a first gate dielectric on the semiconductor substrate; a first gate electrode on the first gate dielectric; a first gate spacer on a sidewall of the first gate electrode and a sidewall of the first gate dielectric; and a first source/drain extension region having an inner edge substantially aligned to an outer edge of the first gate spacer, wherein the first source/drain extension region is a metal silicide region having a Schottky contact with the semiconductor substrate. The semiconductor structure further includes a PMOS device at the surface of the semiconductor substrate. The PMOS device includes a second gate dielectric on the semiconductor substrate; a second gate electrode on the first gate dielectric; a second gate spacer on a sidewall of the second gate electrode and a sidewall of the second gate dielectric, wherein the second gate spacer is thicker than the first gate spacer; a second source/drain extension region having an inner edge substantially aligned to an edge of the first gate stack, wherein the second source/drain extension region has an Ohmic contact with the semiconductor substrate; a source/drain region adjacent the second gate stack, wherein the source/drain region is substantially aligned to an outer edge of the second gate spacer; and a silicide region on the second source/drain region, wherein the first source/drain extension region and the silicide region comprise same metals.

In accordance with yet another aspect of the present invention, a semiconductor structure includes a semiconductor substrate; an NMOS region in the semiconductor substrate, wherein the NMOS region only comprises a base semiconductor substrate having a first valence band; a PMOS region in the semiconductor substrate, wherein the PMOS region comprises an additional semiconductor layer on the base semiconductor substrate, and wherein the additional semiconductor layer has a second valence band lower than the first valence band; and an NMOS device in the NMOS region and a PMOS device in the PMOS region. The NMOS device includes a first gate stack on the base semiconductor substrate and a first Schottky source/drain extension region adjacent the first gate stack. The PMOS device includes a second gate stack over the additional semiconductor substrate and a second Schottky source/drain extension region adjacent the second gate stack, wherein the second Schottky source/drain extension region has a bottom surface lower than a top surface of the additional semiconductor layer, and wherein the first and the second Schottky source/drain extension regions comprise same metals.

In accordance with yet another aspect of the present invention, a method for forming a semiconductor structure includes providing a semiconductor substrate; forming an NMOS device at a surface of the semiconductor substrate, the NMOS device comprising a Schottky source/drain extension region; and forming a PMOS device at the surface of the semiconductor substrate, wherein the PMOS device comprises a source/drain extension region comprising only non-metal materials.

In accordance with yet another aspect of the present invention, a method for forming a semiconductor structure includes providing a semiconductor substrate and forming an NMOS device and a PMOS at a surface of the semiconductor substrate. The step of forming the NMOS device includes forming a first gate stack on the semiconductor substrate; forming a thick spacer on a sidewall of the first gate stack; implanting an n-type impurity to form a first source/drain region; thinning the thick spacer to form a thin spacer; and reacting a top portion of the semiconductor substrate adjacent the thin spacer to form a Schottky source/drain extension region. The step of forming a PMOS device includes forming a second gate stack on the semiconductor substrate; implanting a p-type impurity to form a source/drain extension region; forming a spacer on a sidewall of the second gate stack; implanting a p-type impurity to form a second source/drain region; and reacting a top portion of the second source/drain region to form a source/drain silicide region, wherein the Schottky source/drain extension region of the NMOS device and the source/drain silicide region of the PMOS device are simultaneously formed.

In accordance with yet another aspect of the present invention, a method for forming a semiconductor structure includes providing a base semiconductor substrate comprising a PMOS region and an NMOS region, wherein the base semiconductor substrate has a first valence band; and forming an additional semiconductor layer only on the base semiconductor substrate in the PMOS region, wherein the additional semiconductor layer has a second valence band lower than the first valence band. The method further includes forming an NMOS device in the NMOS region, which comprises forming a first gate stack on the base semiconductor substrate; and forming a first Schottky source/drain extension region adjacent the first gate stack. The method further includes forming a PMOS device in the PMOS region, which comprises forming a second gate stack over the additional semiconductor substrate; and forming a second Schottky source/drain extension region adjacent the second gate stack, wherein the second Schottky source/drain extension region has a bottom surface lower than a top surface of the additional semiconductor layer, and wherein the step of forming the first and the second Schottky source/drain extension regions are simultaneously performed.

The advantageous features of the present invention include reduced Schottky barrier layers for both PMOS and NMOS devices without incurring the high cost of the dual-metal scheme.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Experiments have been performed to study the behavior of p-type metal-oxide-semiconductor (PMOS) and n-type metal-oxide-semiconductor (NMOS) devices. In the experiment, a single-metal scheme is used, wherein a mid-gap metal with a work function of about 4.5 eV is used to form Schottky source/drain extension regions for both PMOS and NMOS devices. These experiment results have revealed that compared to conventional CMOS devices having implanted source/drain extension regions, the drive currents of NMOS devices formed using the single-metal scheme are improved by about 8 percent to about 10 percent, while the drive currents of PMOS devices formed using the single-metal scheme are degraded by about 6 percent. However, the degradation in the drive currents of PMOS devices cannot be compensated for by increasing boron concentrations in the semiconductor substrates adjacent the Schottky junctions. The preferred embodiments of the present invention are provided to address this finding.

Figure 2:
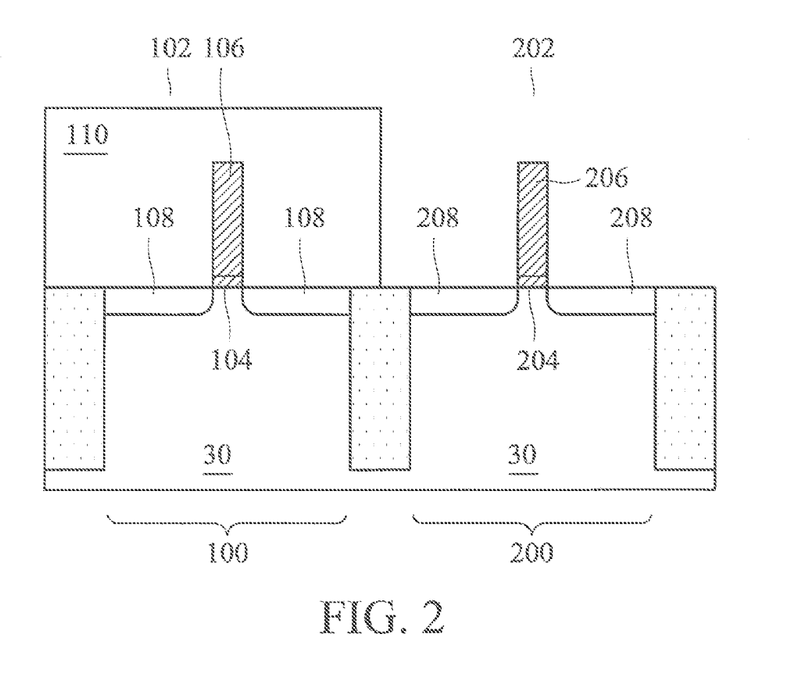
FIGS. 2 through 7 are cross-sectional views of intermediate stages in the manufacturing of a first embodiment of the present invention.

FIGS. 2 through 7 illustrate a first embodiment of the present invention. FIG. 2 illustrates substrate 30 comprising two regions, region 100 for forming an NMOS device and region 200 for forming a PMOS device. Shallow trench isolation (STI) regions are formed in substrate 30 to isolate device regions 100 and 200. Substrate 30 is preferably a bulk silicon substrate, although other commonly used materials and structures such as silicon-germanium (SiGe), silicon-on-insulator (SOI), SiGe-on-insulator, and strained-silicon-on-insulator may also be used. A gate stack including gate dielectric 104 and gate electrode 106 is formed in NMOS region 100. Similarly, a gate stack including gate dielectric 204 and gate electrode 206 is formed in PMOS region 200. As is known in the art, hard masks (not shown) may be formed on the gate stacks for process reasons, wherein the hard masks may include silicon nitride.

Source/drain extension regions 208, or often referred to as LDD regions 208, are then formed. Preferably, photo resist 110 is formed and patterned to mask NMOS region 100. PMOS region 200 is then implanted with a p-type impurity such as boron, forming LDD regions 208. Photo resist 110 is then removed. In the preferred embodiment, no LDD regions are formed in NMOS region 100. In other embodiments, LDD regions 108 are formed. Similarly, during the n-type impurity implantation, PMOS region 200 is masked by a photo resist (not shown), and an implantation of an n-type impurity is performed to NMOS region 100, forming LDD regions 108. In subsequently drawings, LDD regions 108 are not shown.

Figure 3:
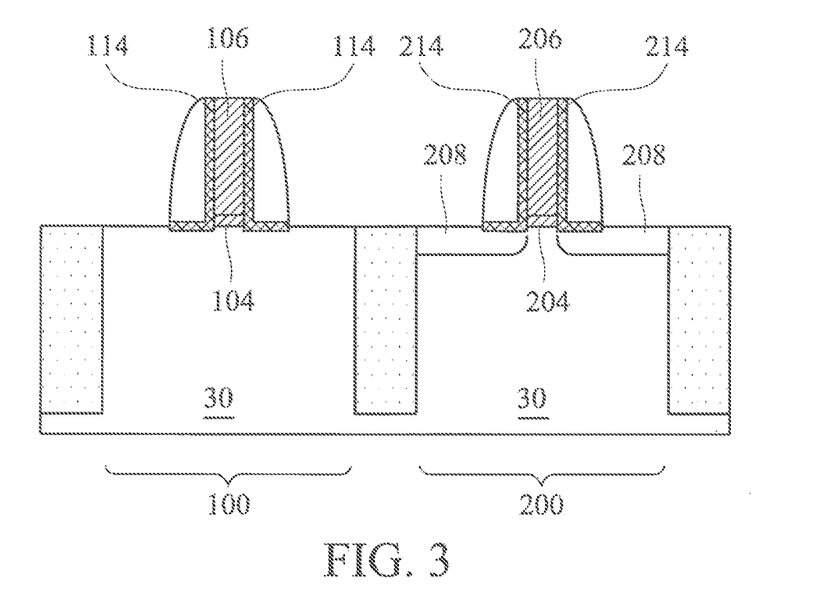

FIG. 3 illustrates the formation of spacers 114 and 214 in regions 100 and 200, respectively. As is known in the art, the formation of spacers 114 and 214 preferably includes depositing one or more dielectric layer(s) and etching the dielectric layer(s). The remaining portions of the dielectric layer(s) become spacers. The deposition of the dielectric layer(s) includes commonly used techniques, such as plasma enhanced chemical vapor deposition (PECVD), low-pressure chemical vapor deposition (LPCVD), sub-atmospheric chemical vapor deposition (SACVD), and the like. The resulting spacers 114 and 214 each may comprise a single layer or more than one layer, such as a silicon nitride layer on a silicon oxide layer. In alternative embodiments (not shown), spacers 114 and 214 each include a thin spacer (not shown) on the sidewall of the respective gate stacks, and a dispensable spacer (not shown) on the sidewall of the respective thin spacer.

Figure 4:
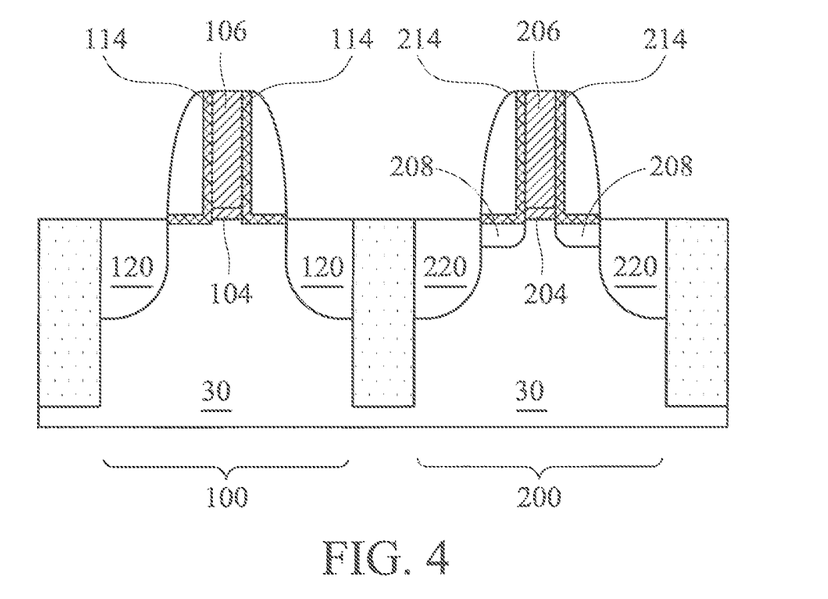

FIG. 4 illustrates the formation of source/drain regions 120 and 220. As is known in the art, source/drain regions 120 and 220 may be recessed in or elevated above substrate 30 (using, e.g., epitaxially grown regions). In the preferred embodiment, source/drain regions 120 and 220 are formed by implanting impurities into semiconductor substrate 30. Gate electrodes 106 and 206 are preferably implanted simultaneously with the implantation of the respective source/drain regions to reduce sheet resistance. When region 100 is implanted with an n-type impurity, region 200 is masked by a photo resist (not shown). Similarly, when region 200 is implanted with a p-type impurity, region 100 is masked by a photo resist (not shown).

In alternative embodiments, SiGe stressors (not shown) are formed for the PMOS device. Preferably, a photo resist (not shown) is formed to cover NMOS region 100. Recesses are formed in substrate 30 along outside edges of spacers 214, preferably by etching. The SiGe stressors are then formed in the recesses, preferably by an epitaxial growth. The photo resist is then removed.

Figure 5:
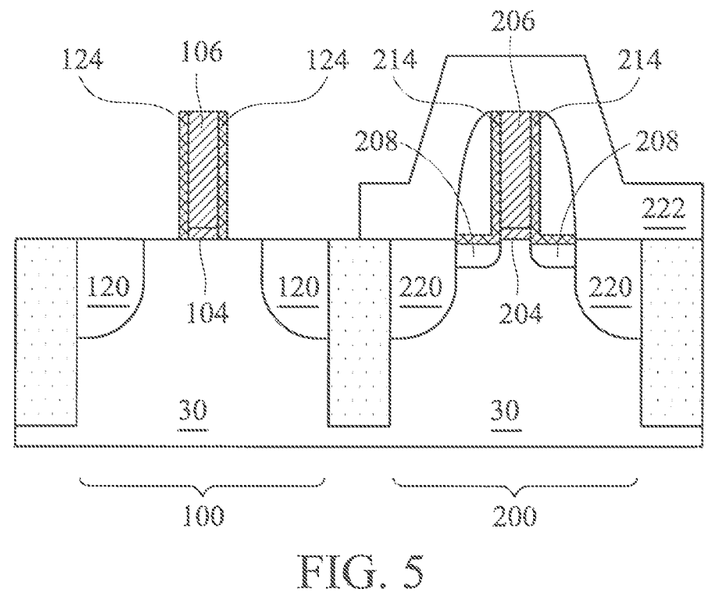

FIG. 5 illustrates the thinning of sidewall spacers 114. Mask 222 is formed to cover PMOS region 200, wherein mask 222 may include photo resist or other commonly used mask materials. In an exemplary embodiment wherein sidewall spacers 114 include a silicon nitride layer on a liner oxide layer, the silicon nitride layer is first stripped. The liner oxide layer is then etched, preferably by a dry etching to remove horizontal portions of the liner oxide layer, hence the vertical portion forms thin spacer 124. In the case spacers 114 each include a dispensable spacer on a thin spacer, the dispensable spacers are removed, leaving the thin spacers. Mask 222 is then removed.

Figure 6:
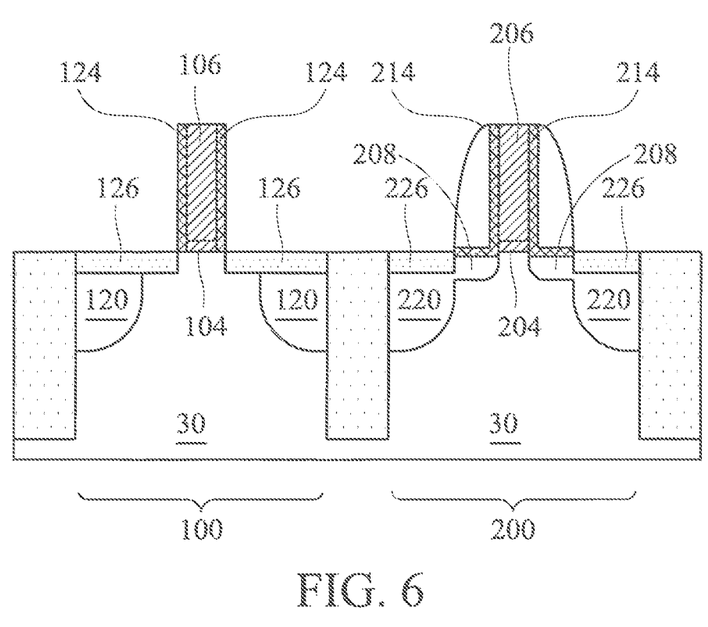

Referring to FIG. 6, a silicidation process is performed. A thin metal layer is blanket formed over the structure formed in preceding steps. The substrate is then heated, which causes silicon to react with the metal where contacted. After the reaction, a layer of metal silicide is formed between substrate 30 and the metal. The un-reacted metal is selectively removed through the use of an etchant that attacks the metal but does not attack silicide. In the resulting structure, Schottky source/drain extension regions 126 are formed in NMOS region 100, while source/drain silicide regions 226 are formed in PMOS region 200.

In the preferred embodiment, the metal used for the silicidation process has a low work function, for example, lower than about 4.25 eV. More preferably, the metal has a band-edge work function of close to the conduction band of semiconductor substrate 30. Accordingly, the barrier height for the resulting NMOS device is lowered, and the drive current is increased. Alternatively, mid-gap metals are used. The exemplary metals include erbium, holmium, titanium, hafnium, zirconium, cobalt, nickel, and combinations thereof. On the other hand, since source/drain extension regions 208 are formed by implantation, the degradation to the PMOS device, as discussed in preceding paragraphs, is eliminated.

Figure 7:
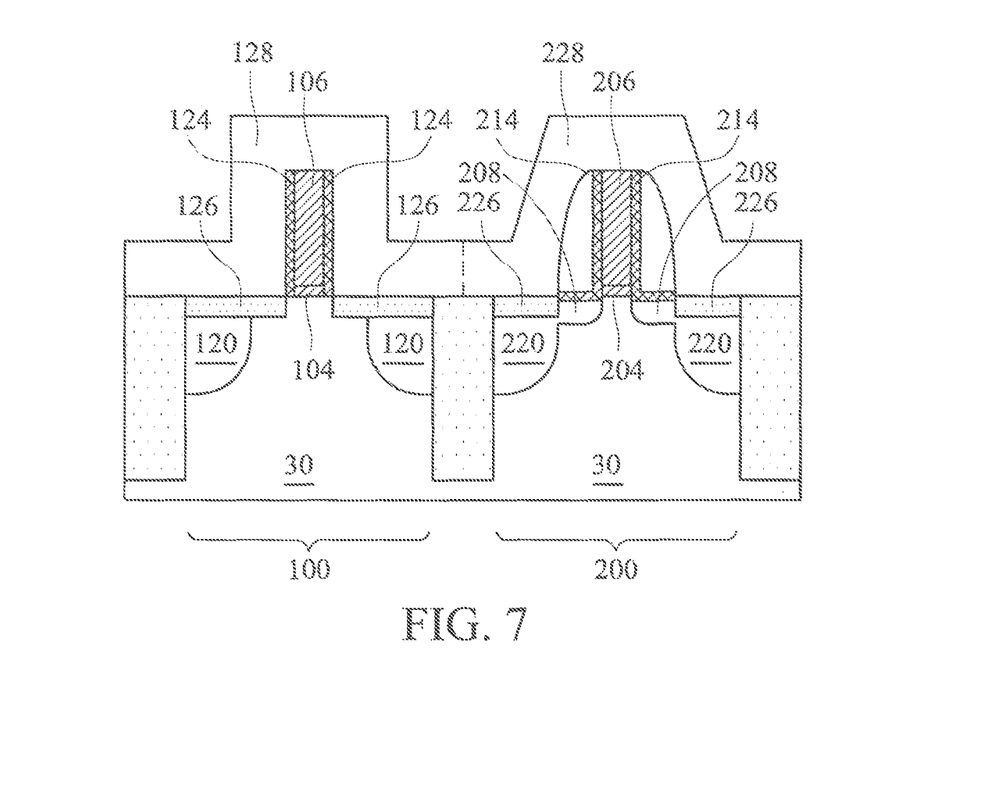

FIG. 7 illustrates the formation of contact etch stop layers (CESL) 128 and 228. In an embodiment, CESLs 128 and 228 are portions of a same continuous layer, which preferably has a tensile stress. Advantageously, with thin spacers 124, the tensile stress applied to the channel region of the NMOS device is high. On the other hand, due to thick spacers 214, the detrimental tensile stress applied to the channel region of the PMOS device is low. In alternative embodiments, CESL 128 has an inherent tensile stress, while CESL 228 has an inherent compressive stress.

Figure 8:
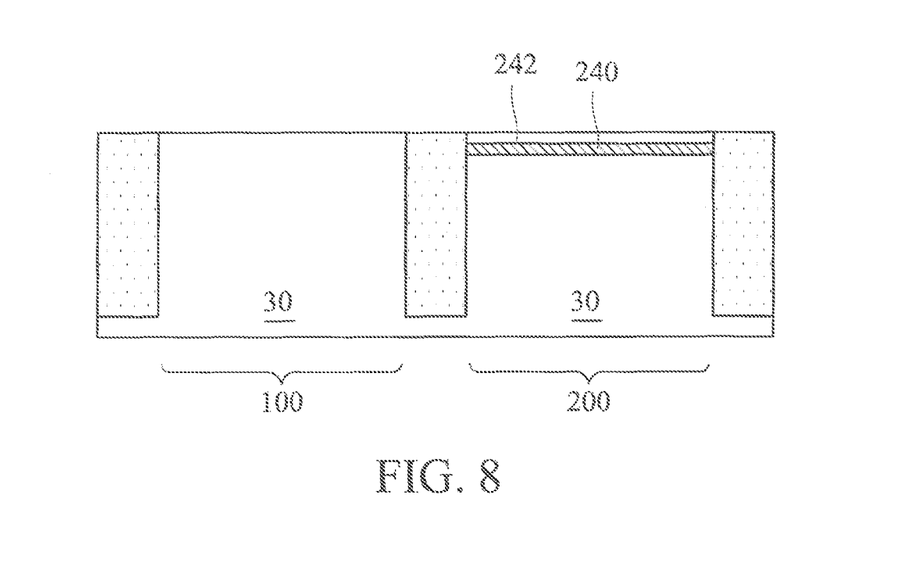
FIGS. 8 through 12 are cross-sectional views of intermediate stages in the manufacturing of a second embodiment of the present invention.

FIGS. 8 through 12 illustrate a second embodiment of the present invention, wherein both PMOS and NMOS devices have Schottky source/drain extension regions. To simplify the discussion, like reference numerals in the first embodiment are used to reference like elements in the second embodiment, unless specified otherwise. Referring to FIG. 8, base semiconductor substrate 30 is provided, which includes NMOS region 100 and PMOS region 200. Base semiconductor substrate 30 preferably comprises silicon, although other commonly used semiconductor materials may be used. In PMOS region 200, SiGe layer 240 is formed on base semiconductor substrate 30, followed by the formation of silicon layer 242 on SiGe layer 240. SiGe layer 240 and silicon layer 242 may be formed by epitaxial growths. Alternatively, SiGe layer 240 may be formed by implanting germanium into base silicon substrate 30. In an exemplary embodiment, SiGe layer 240 has a thickness of less than about 300 Å, while silicon layer 242 has a thickness of between about 50 Å and about 200 Å. Preferably, silicon layer 242 is thin enough, so that in the subsequent silicidation process, silicon layer 242 will fully react with a metal, and the underlying SiGe layer 240 will react with the metal, at least partially, and more preferably entirely.

In alternative embodiments, SiGe layer 240 may be replaced by other materials having lower valence bands than the valence bands of silicon layer 242 and base semiconductor substrate 30.

Figure 9:
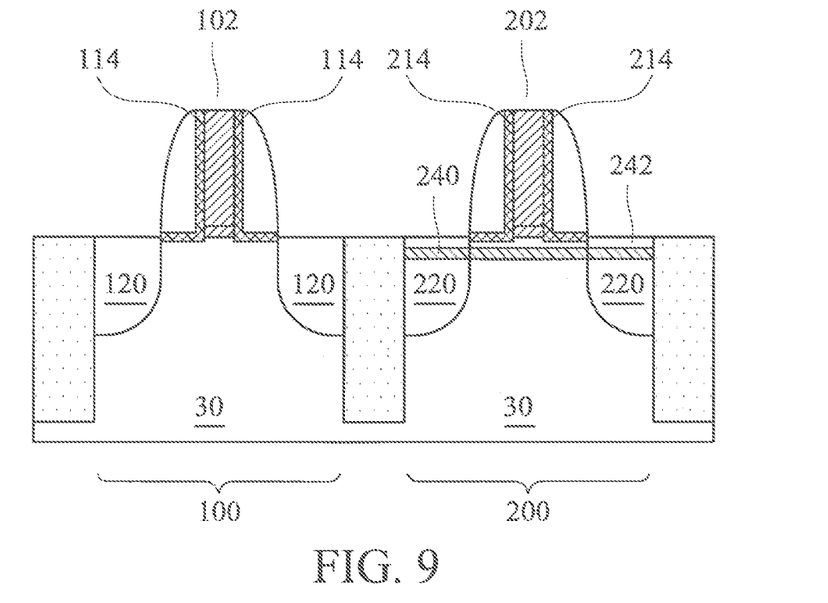

FIG. 9 illustrates the formation of gate stacks 102 and 202, source/drain regions 120 and 220, and spacers 114 and 214. The process details are essentially the same as in the first embodiment, and thus are not repeated herein. Preferably, no implantations are performed to form LDD regions in both regions 100 and 200, although they can be formed.

Figure 10:
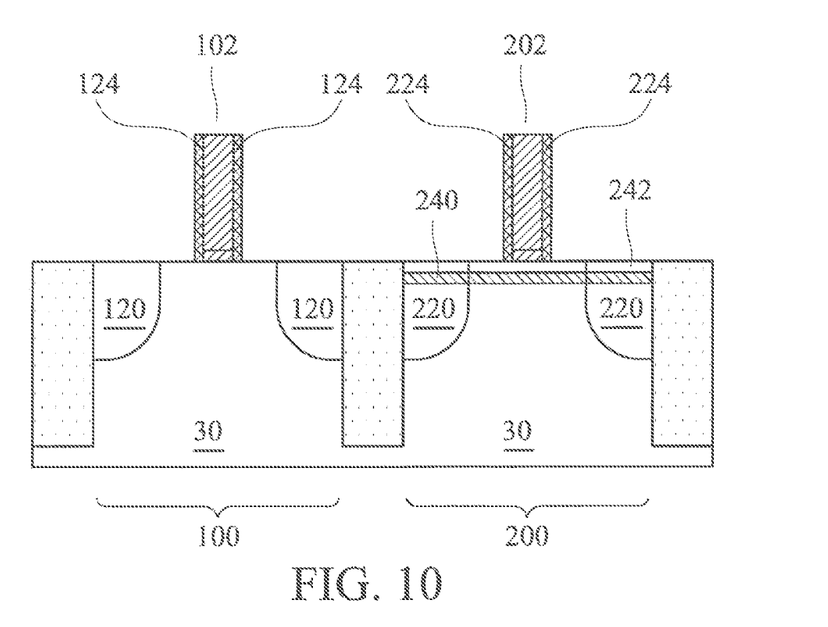
Figure 11A:
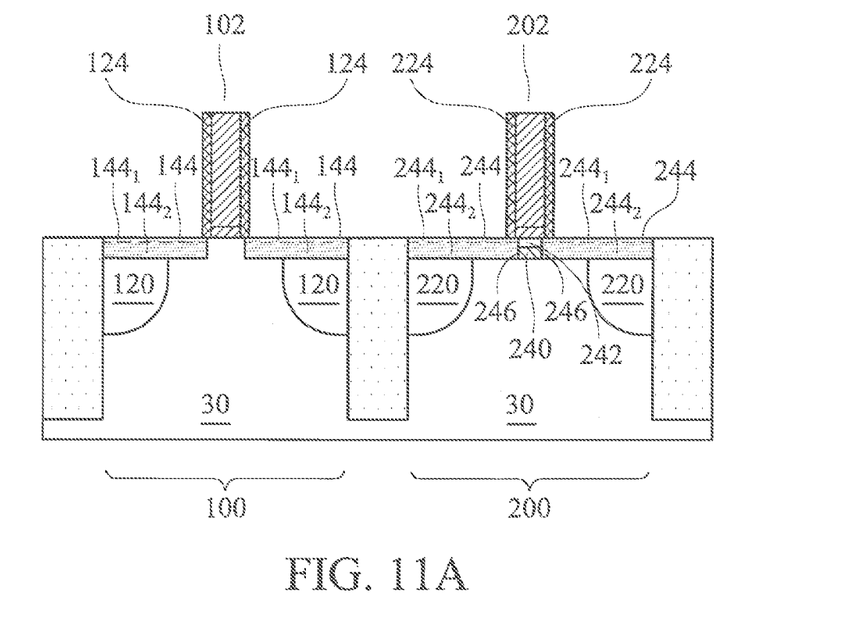
Figure 11B:
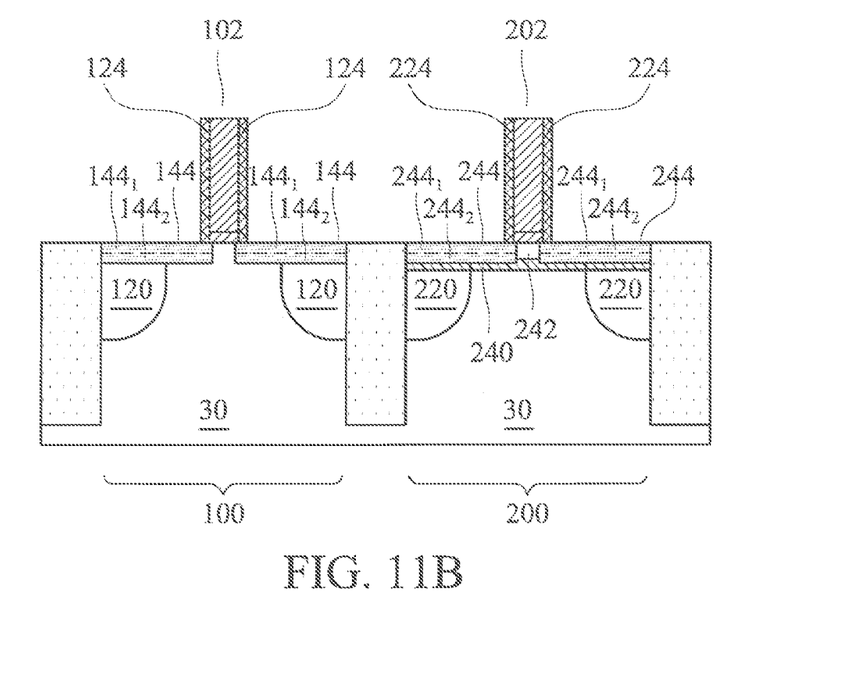

In FIG. 10, spacers 114 and 214 are thinned to form thin spacers 124 and 224, respectively. Subsequently, a silicidation is performed to form Schottky source/drain extension regions 144 and 244, forming structures as shown in FIGS. 11A and 11B. The metal used for the silicidation preferably has a work function of between the conduction band of base semiconductor substrate 30 and the valence band of SiGe layer 240. The appropriate metals include erbium, platinum, nickel, cobalt, ytterbium, magnesium, aluminum, titanium, and combinations thereof. In the preferred embodiment, SiGe layer 240 fully reacts with the metal during the silicidation process, as illustrated in FIG. 11A. In other embodiments, as shown in FIG. 11B, only a top portion of SiGe layer 240 reacts with the metal to form germano-silicide, while the bottom portion of SiGe layer 240 is not reacted. In both FIGS. 11A and 11B, the Schottky source/drain extension regions 144 and 244 include silicide layers $144_1$ and $244_1$ on germano-silicide layers $144_2$ and $244_2$, respectively.

It is appreciated that SiGe has a lower valence band than silicon. The band gap between the valence band of SiGe and the conduction band of silicon is accordingly lower than the band gap of silicon. At interfaces between SiGe layer 240 and the respective Schottky source/drain extension region 244, the barrier height is lowered. In this embodiment, even though a single-metal scheme is used to form Schottky source/drain extension regions for both PMOS and NMOS devices, with an appropriate metal selected, at least one of the NMOS and PMOS devices, and may be both, can have lowered Schottky barrier heights.

Figure 12:
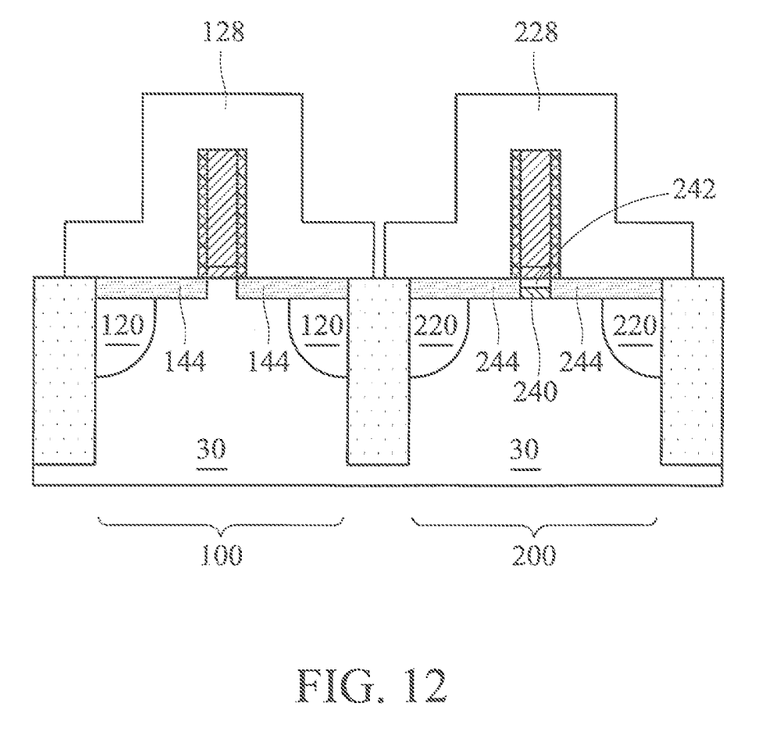

In subsequent process steps, CESLs 128 and 228 are formed. Since both the PMOS and NMOS devices have thin spacers, CESL 228 preferably has a compressive stress, and CESL 128 preferably has a tensile stress.

The embodiments of the present invention have several advantageous features. By using the single-metal scheme to form Schottky source/drain extension regions, the cost is lower than the dual-metal scheme, while the performance of the CMOS devices is not sacrificed. The formation of the Schottky source/drain extension regions is integrated with the formation of thin spacers to further improve the performance of CMOS devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a first and a second gate stack over a semiconductor substrate;
   forming a first and a second gate spacer on sidewalls of the first and the second gate stacks, respectively;
   implanting the semiconductor substrate to form a first and a second source/drain region substantially aligned to sidewalls of the first and the second gate spacers, respectively;
   thinning the first gate spacer to form a thin spacer, wherein the second gate spacer is not thinned, and the thinning the first gate spacer comprises removing a horizontal leg of an L-shaped liner, and leaving a vertical leg of the L-shaped liner un-removed;
   after the step of thinning, forming a first silicide region substantially aligned to a sidewall of the thin spacer; and
   forming a second silicide region substantially aligned to a sidewall of the second gate spacer.

2. The method of claim 1, wherein the first silicide region comprises a Schottky source/drain extension region, and wherein no Schottky source/drain extension region is formed between the second source/drain region and the second gate stack.

3. The method of claim 1 further comprising implanting the semiconductor substrate to form a source/drain extension region, wherein the source/drain extension region has an edge substantially aligned to an edge of the first gate stack.

4. The method of claim 1, wherein the first silicide region and the second silicide region comprise a mid-gap metal.

5. The method of claim 1, wherein the first silicide region and the second silicide region comprise a metal having a band-edge work function close to a conduction band of silicon.

6. The method of claim 1 further comprising:
   forming a first contact etch stop layer (CESL) contacting a sidewall of the thin spacer, wherein the first CESL is configured to cause a tensile stress to be applied to a channel region directly under the first gate stack; and
   forming a second CESL contacting a sidewall of the second gate spacer, wherein the second CESL is configured to cause a compressive stress to be applied to a channel region directly under the second gate stack.

7. The method of claim 6, wherein the thinning the first gate spacer comprises removing a horizontal leg of an L-shaped liner, and leaving a vertical leg of the L-shaped liner un-removed.

8. The method of claim 1, wherein the first gate stack, the first gate spacer, and the first source/drain region are portions of an N-type Metal-Oxide-Semiconductor (NMOS) device, and the second gate stack, the second gate spacer, and the second source/drain region are portions of a P-type Metal-Oxide-Semiconductor (PMOS) device.

9. A method comprising:
   forming a first gate stack and a second gate stack over a semiconductor substrate;
   forming a first gate spacer on a sidewall of the first gate stack;
   forming a second gate spacer on a sidewall of the second gate stack;
   thinning the first gate spacer without thinning the second gate spacer;
   after the thinning, siliciding a surface portion of the semiconductor substrate to form a Schottky source/drain extension region on a side of the first gate stack;
   implanting the semiconductor substrate with an n-type impurity to form a first source/drain region, wherein the first gate stack, the Schottky source/drain extension region, and the first source/drain region form a N-type Metal-Oxide-Semiconductor (NMOS) device;
   implanting the semiconductor substrate to form a source/drain extension region on a side of the second gate stack; and
   implanting the semiconductor substrate with a p-type impurity to form a second source/drain region, wherein the second gate stack, the source/drain extension region, and the second source/drain region form a P-type Metal-Oxide-Semiconductor (PMOS) device.

10. The method of claim 9 further comprising, at a same time the step of siliciding is performed:

forming a source/drain silicide overlapping the second source/drain region, wherein the source/drain extension region is not silicided.

11. The method of claim 9, wherein the step of siliciding is performed using a band-edge metal having a band-edge work function close to a conduction band of the semiconductor substrate.

12. The method of claim 9, wherein the step of siliciding is performed using a metal having a mid-gap work function close to a middle level of a conduction band and a valence band of the semiconductor substrate.

13. The method of claim 9, wherein after the step of thinning the first gate spacer, a thin spacer is left on the sidewall of the first gate stack.

14. The method of claim 9 further comprising:
 forming a first contact etch stop layer (CESL) contacting a sidewall of the thinned first gate spacer, wherein the first CESL is configured to cause a tensile stress to be applied to a channel region directly under the first gate stack; and
 forming a second CESL contacting a sidewall of the second gate spacer, wherein the second CESL is configured to cause a compressive stress to be applied to a channel region directly under the second gate stack.

15. A method comprising:
 forming a first gate stack and a second gate stack over an NMOS region and PMOS region, respectively, of a semiconductor substrate;
 implanting the PMOS region of the semiconductor substrate to form a source/drain extension region;
 forming a first and a second gate spacer on sidewalls of the first and the second gate stacks, respectively;
 implanting the NMOS region and the PMOS region to form a first and a second source/drain region adjacent the first gate stack and the second gate stack, respectively, wherein the first source/drain region is of n-type, and the second source/drain region is of p-type;
 thinning the first gate spacer, wherein the second gate spacer is masked when the step of thinning is performed; and
 after the step of thinning, siliciding surface portions of the NMOS region and the PMOS region to simultaneously form a Schottky source/drain extension region in the NMOS region and a source/drain silicide region in the PMOS region.

16. The method of claim 15, wherein no implantation is performed to form source/drain extension regions in the NMOS region.

17. The method of claim 15, wherein the step of siliciding is performed using a band-edge metal having a band-edge work function close to a conduction band of the semiconductor substrate.

18. The method of claim 15, wherein the step of siliciding is performed using a metal having a mid-gap work function close to a middle level of a conduction band and a valence band of the semiconductor substrate.

19. The method of claim 15, wherein the step of implanting the PMOS region to form the source/drain extension region is performed with no spacer formed on sidewalls of the second gate stack.

20. The method of claim 15, wherein after the step of thinning, a thin spacer is left on a sidewall of the first gate stack, and wherein the Schottky source/drain extension region comprises an edge substantially aligned to an edge of the thin spacer.

* * * * *